(12) United States Patent
Li et al.

(10) Patent No.: US 8,053,951 B2
(45) Date of Patent: Nov. 8, 2011

(54) THIN FILM PIEZOELECTRIC ACTUATORS

(75) Inventors: Youming Li, San Jose, CA (US); Jeffrey Birkmeyer, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 25 days.

(21) Appl. No.: 12/603,800

(22) Filed: Oct. 22, 2009

(65) Prior Publication Data

US 2010/0141097 A1    Jun. 10, 2010

Related U.S. Application Data

(60) Provisional application No. 61/111,278, filed on Nov. 4, 2008.

(51) Int. Cl.
    *H01L 41/09* (2006.01)
(52) U.S. Cl. ........................................ 310/324
(58) Field of Classification Search .................. 310/324, 310/328
    See application file for complete search history.

(56) References Cited

U.S. PATENT DOCUMENTS

| | | | |
|---|---|---|---|
| 2003/0092203 A1* | 5/2003 | Murai | 438/3 |
| 2003/0234835 A1 | 12/2003 | Torii et al. | |
| 2004/0004649 A1 | 1/2004 | Bibl et al. | |
| 2004/0173823 A1* | 9/2004 | Murai | 257/252 |
| 2005/0099467 A1 | 5/2005 | Bibl et al. | |
| 2005/0236710 A1* | 10/2005 | Akiyama et al. | 257/744 |
| 2006/0082257 A1 | 4/2006 | Bibl et al. | |
| 2007/0257580 A1 | 11/2007 | Chen et al. | |
| 2008/0224571 A1* | 9/2008 | Miyazawa et al. | 310/358 |

FOREIGN PATENT DOCUMENTS

JP    63-104845 A  *  5/1988  ........... 347/68

* cited by examiner

*Primary Examiner* — Thomas Dougherty
(74) *Attorney, Agent, or Firm* — Fish & Richardson P.C.

(57) ABSTRACT

A MEMS device with a thin piezoelectric actuator is described. A substrate with a first surface has a crystalline orientation prompting layer on the first surface. A piezoelectric portion contacts the crystalline orientation prompting layer and has an orientation corresponding to the orientation of the crystalline orientation prompting layer. A dielectric material surrounds the piezoelectric portion. The dielectric material is formed of an inorganic material.

26 Claims, 4 Drawing Sheets

THIN FILM PIEZOELECTRIC ACTUATORS

This application claims the benefit of U.S. Provisional Application Ser. No. 61/111,278, filed Nov. 4, 2008, and incorporated herein by reference.

BACKGROUND

The present disclosure relates to forming actuators for microelectromechanical systems.

Microelectromechanical systems (MEMS) have an electrical component, where an electrical signal actuates or is generated by actuation of an actuatable structure in the MEMS. A MEMS device typically has actuatable mechanical structures formed in a semiconductor substrate using conventional semiconductor processing techniques. The MEMS device can include a single structure or multiple structures. For example, in a microfluidic device, multiple fluidic chambers and actuators can be formed in a single MEMS device die. A MEMS device with multiple structures is described in U.S. Publication No. 2005-0099467.

In devices with multiple structures, such as multiple individual actuators and associated mechanical structures, it can be desirable for the actuators to have very uniform properties. That is, it is desirable for the actuator of each structure to have uniform properties when compared with the actuator of other structures across the device. Such uniformity can ensure that when the same signal is applied to each actuator, the same result is achieved at each mechanical structure.

SUMMARY

In one aspect, a method of forming an actuator includes forming an aperture in a dielectric layer which overlies a substrate, forming a layer of piezoelectric material in the aperture and on the dielectric layer, and planarizing the layer of piezoelectric material to remove portions of the piezoelectric material from over the dielectric layer, leaving a section of piezoelectric material in the aperture.

Implementations may include the following features. The layer of piezoelectric material can be formed by sputtering. The dielectric layer may include an inorganic material. The layer of piezoelectric material may be formed on a crystalline orientation promoting layer. An electrode may be formed over the section of piezoelectric material in the aperture. A recess may be formed in the substrate, and the aperture may be formed in the dielectric layer adjacent to the recess in the substrate. Forming the layer of piezoelectric material may include forming a layer of lead zirconium titanate, lead niobium zirconium titanate or lead lanthanum zirconate titanate. The aperture in the dielectric layer may be formed by etching. Forming the layer of piezoelectric material may include forming an oriented crystalline portion in the aperture and an amorphous portion on the dielectric layer.

In another aspect, a device includes a substrate with a first surface, a crystalline orientation prompting layer on the first surface of the substrate, a piezoelectric portion contacting the crystalline orientation prompting layer and having an orientation corresponding to the orientation of the crystalline orientation prompting layer, and a dielectric material surrounding the piezoelectric portion.

Implementations may include the following features. The dielectric material may be an inorganic dielectric material, e.g., silicon dioxide or silicon nitride. The substrate may have a recess formed therein and the piezoelectric portion may overlie the recess. The substrate may have an outlet on a surface other than the first surface and fluidly connected to the recess. The device may include an electrode on an opposite side of the piezoelectric portion from the crystalline orientation prompting layer. An adhesion prompting layer may be between the dielectric layer and the crystalline orientation prompting layer. A second adhesion prompting layer may be between the substrate and the crystalline orientation prompting layer. The adhesion prompting layer may include chromium, molybdenum, titanium or tungsten. The crystalline orientation prompting layer may include platinum, palladium, gold, silver, iridium or nickel. A surface of the dielectric material furthest from the crystalline orientation prompting layer may be co-planar with a surface of the piezoelectric portion.

Embodiments of the devices and techniques described herein can include one or more of the following advantages. A piezoelectric layer can be deposited in an aperture and over a dielectric layer. The piezoelectric layer within the aperture can have a crystalline structure with a highly uniform crystalline orientation, because the piezoelectric layer is formed on a crystalline orientation prompting layer. Transition boundaries exist between the crystalline portion and an amorphous phase portion of the piezoelectric layer over the dielectric layer. These boundaries can act as cracking stops, such that any defect or stress related cracks originating in the amorphous portions are unlikely to penetrate into the highly crystalline oriented portion, or active region. This can lead to lower rates of defects in the completed MEMS devices and higher product yields over traditional methods. The methods used to form the piezoelectric material on the substrate can form piezoelectric material with very uniform and desirable properties, such as high density, low voids and high $d_{31}$ coefficients. When each actuator has consistent properties, the individual structures associated with the structures can be operated with very uniform results when the same electrical signals are communicated to each of the structures.

DESCRIPTION OF DRAWINGS

Like reference symbols in the various drawings indicate like elements.

DETAILED DESCRIPTION

Figure 1:
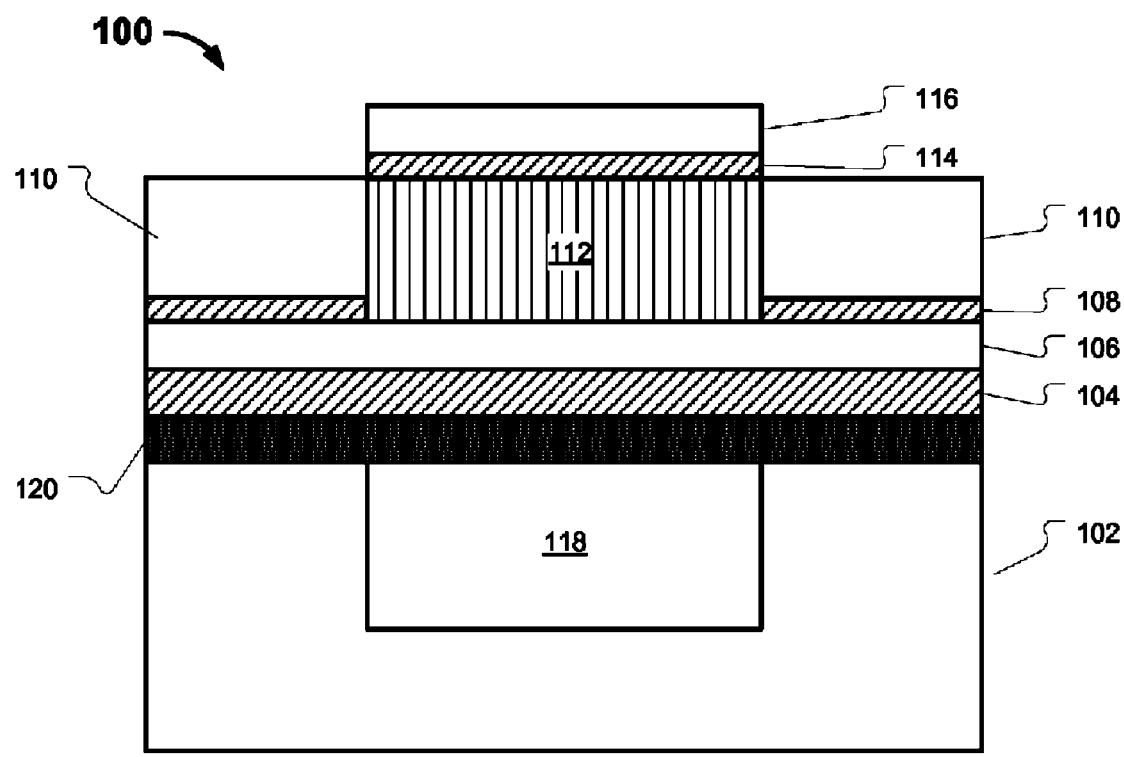
FIG. 1 shows an example of a wafer having a piezoelectric layer formed in a recess on the wafer.

FIG. 1 shows an example of a MEMS device 100 containing an actuator which can be electrically actuated to act on an adjacent structural portion. The MEMS device 100 includes a substrate 102, an optional first adhesion prompting conductive layer 104, a crystalline orientation prompting layer 106, an optional second conductive layer 108, a dielectric layer 110, a third adhesion prompting conductive layer 114, a conductive electrode layer 116, and a highly crystalline oriented piezoelectric actuator region 112. In particular, the crystalline piezoelectric actuator region 112 can be a piezoelectric layer in which columns 124 that extend from the bottom to the top of the layer have the same crystalline orientation. The polycrystalline thin film of the piezoelectric layer can have a large grain size, e.g., the columns can be about 0.3 to 0.4 microns in diameter.

The first adhesion prompting layer 104 can have a thickness of 100 to 500 angstroms, e.g., 200 to 300 angstroms. The crystalline orientation prompting layer 106 can have a thickness of 500 to 5000 angstroms, e.g., 1500 to 2300 angstroms. The piezoelectric layer 112 can have a thickness of 0.2 to 10 microns, e.g., 3 to 6 microns. The dielectric layer 110 can have a thickness of 5 angstroms to 5 microns, e.g., 20 angstroms to 1 micron, e.g., 100 to 1000 angstroms.

In addition to these features, a cavity 118 and a thin film membrane 120 are part of the substrate 102. In some embodiments, the cavity 118 and membrane 120 are formed in the substrate 102 before any layers that form the actuator are deposited. The thin film membrane, which is optional, separates the cavity from the actuating elements of MEMS device 100. In some embodiments, layers can be combined, such as the third adhesion prompting conductive layer 114 and conductive electrode layer 116 or the first adhesion prompting conductive layer 104 and a crystalline orientation prompting layer 106, into a single layer or can each be formed of two or more layers.

In this example, the MEMS device 100 is a fluid ejection device constructed for ejecting droplets or streams of fluids, such as ink. A suitable ink jet device is described in U.S. Publication No. 2005-0099467, which is incorporated herein by reference. If the MEMS device 100 is used in an ink jet print-head, the cavity 118 can be filled with ink during operation. When a bias is placed across piezoelectric actuator region 112, such as by applying an electric voltage between the electrode 116 and grounding adhesion prompting conductive layer 104, the piezoelectric actuator region 112 can bend in response to the applied voltage. The bending of the piezoelectric actuator region 112 places pressure on membrane 120, compressing cavity 118 and causing a drop of ink to be ejected from a nozzle (not shown) that is in fluid communication with the cavity 118 and is in the bottom or side of the substrate 102.

Figure 2:
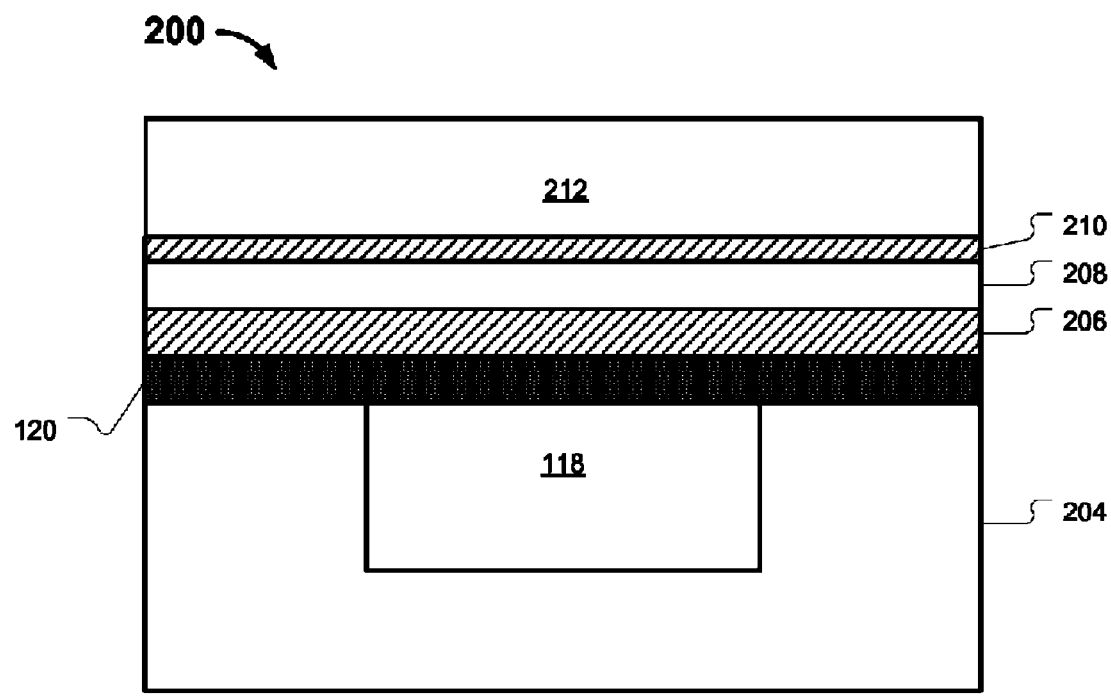
FIG. 2 shows an example of a starting wafer on which a multi-layered stack of thin films has been deposited.

FIG. 2 shows a wafer 200 from which a MEMS device, such as the MEMS device 100 from FIG. 1, can be manufactured. At the base of the wafer 200 there is a substrate layer 204. The substrate layer 204 can be formed of a semiconductor material, such as silicon. In some implementations the substrate layer can include one or more materials other than silicon, such as oxide or doping materials. In addition to the substrate layer 204, the wafer 200 contains a multi-layered stack of thin films that is deposited on the substrate layer 204. The layers of the multi-layered stack can be deposited using a variety of deposition techniques, for example, chemical vapor deposition (CVD) physical vapor deposition (PVD) or atomic layer deposition (ALD).

In the example depicted in FIG. 2, a first adhesion prompting layer 206 is deposited directly on top of the substrate 204. The first adhesion prompting layer 206 can include a conductive material, e.g., a metal, such as chromium, molybdenum, titanium, titanium-tungsten, or combinations thereof. An adhesion layer is used in wafer deposition to improve adhesion of a subsequent layer to the wafer. Because the layer is formed of a conductive material, the layer can also serve as an electrode. In this example, a crystalline orientation prompting layer 208 is deposited on top of the first adhesion prompting layer 206. The crystalline orientation prompting layer 208 can include platinum, palladium, gold, silver, iridium, nickel or combinations thereof. In some embodiments, the first adhesion prompting layer 206 and crystalline orientation prompting layer 208 are both formed of a conductive material so that the layers together can later serve as electrodes of an actuator. In particular, the first adhesion prompting layer 206 can be used to improve adhesion where the underlying layer (e.g., the membrane 120), is silicon and the crystalline orientation prompting layer 208 is iridium, gold, or platinum.

In some embodiments, the multi-layered stack of thin films contains a second adhesion prompting layer 210 deposited on top of the crystalline orientation prompting layer 208. The second adhesion prompting layer 210 can include conductive material, e.g., a metal, such as chromium, molybdenum, titanium, titanium-tungsten, or combinations thereof. In some embodiments, the first and second adhesion prompting layers 206, 210 are formed of the same material or have the same composition.

The multi-layered stack of thin films contains a dielectric layer 212 deposited on top of the adhesion prompting layer 210. The dielectric layer 212 can include an inorganic material, such as silicon oxide, silicon nitride, or another nitride compound.

In some embodiments, the multi-layered stack of thin films contains more or fewer adhesion layers than shown in the example in FIG. 2.

Figure 3:
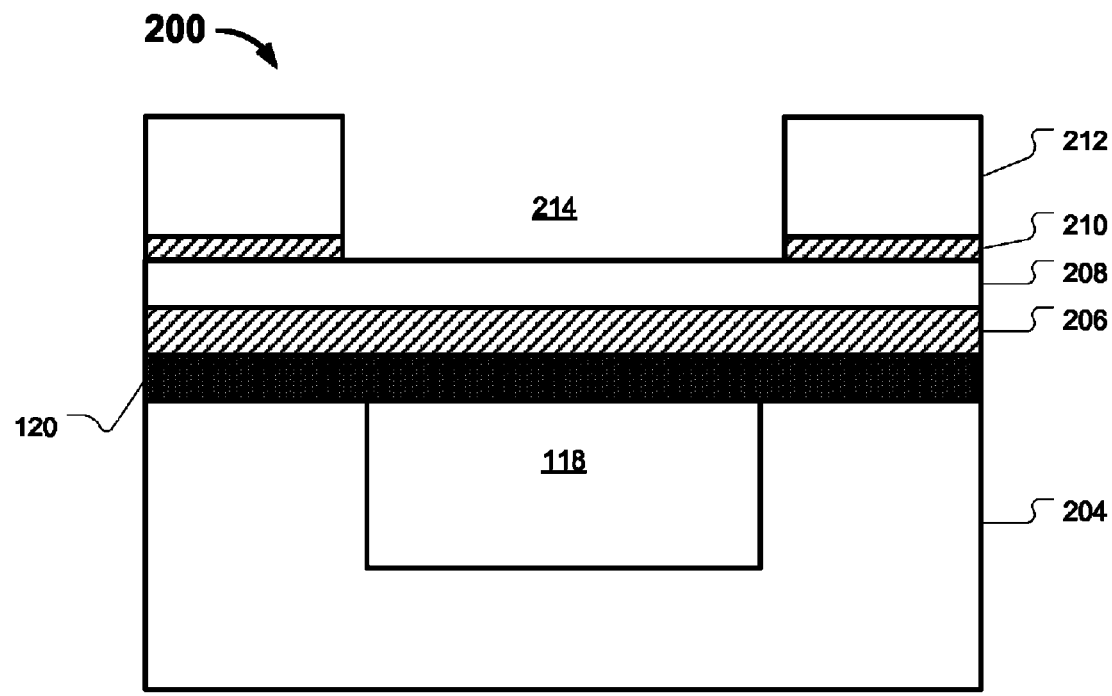
FIG. 3 shows an example of a wafer after a portion of a dielectric layer and adhesion layer have been removed.

FIG. 3 shows the wafer 200 from FIG. 2 in which a portion of the dielectric layer 212 and the second adhesion prompting layer 210 have been removed to create an aperture 214. The portions of the dielectric layer 212 and the adhesion prompting layer 210 can be removed using any of several techniques for removing material from a wafer surface, such as lithography with wet etch or dry etch. For example, a photoresist can be deposited to cover the wafer. The photoresist is then selectively exposed to radiation such as ultraviolet light, infrared light, electrons, or x-rays. After exposure, the photoresist material is developed, which destroys unwanted areas of the photoresist, exposing the corresponding areas of the underlying layer that are to be removed by etching. Regions of the underlying material that are no longer protected by photoresist after development are then etched by exposure to reactive chemicals.

The aperture 214 defines an active region where a highly crystalline oriented piezoelectric material is to be deposited. In this example, the crystalline orientation prompting layer 208 is exposed only where a highly crystalline oriented piezoelectric layer is desired. The inactive region is defined by the areas where the dielectric layer 212 remains intact. The piezoelectric material tends to form in an amorphous phase over the inactive area.

Figure 4:
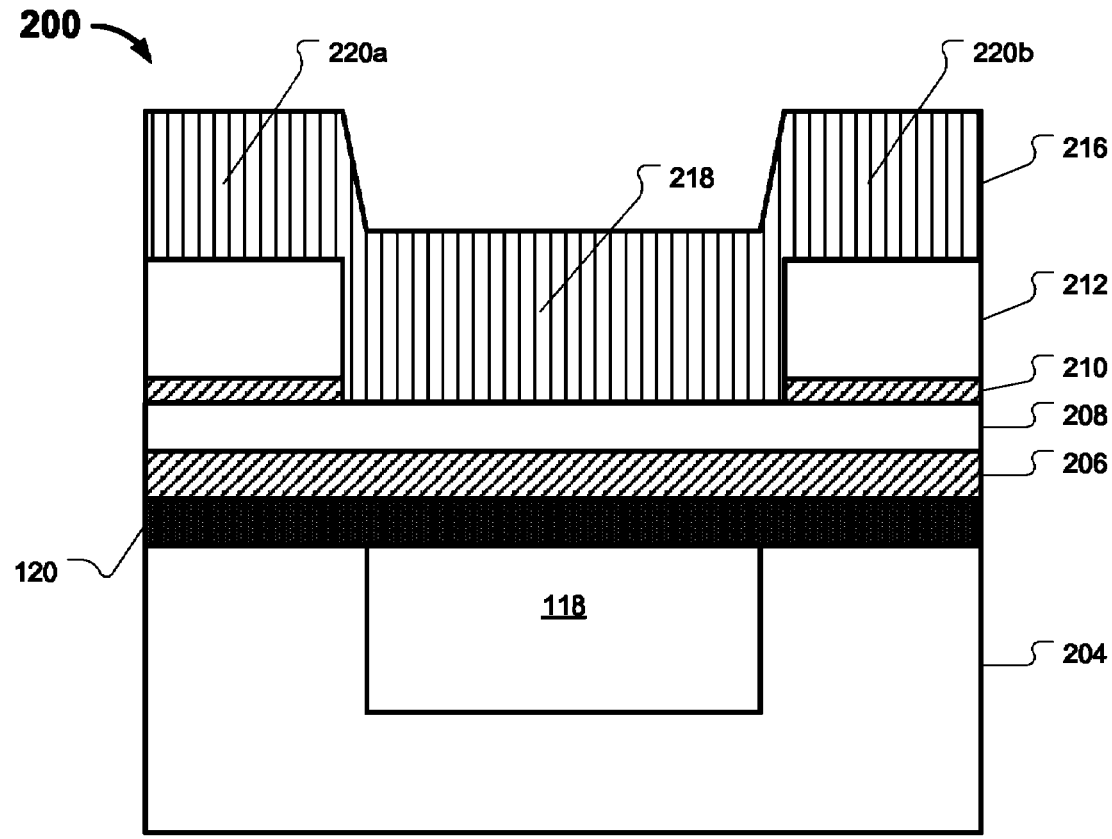
FIG. 4 shows an example of a wafer after a piezoelectric layer has been deposited.

FIG. 4 shows the wafer 200 from FIG. 3 in which a piezoelectric layer 216 has been deposited over the area defining the aperture 214 and the areas over the remaining portion of the dielectric layer 212. The piezoelectric layer 216 can include lead zirconium titanate (PZT), lead niobium zirconium titanate (PNZT), or lead lanthanum zirconate titanate (PLZT). In the example depicted, the piezoelectric layer 216 can be deposited using physical vapor deposition (PVD), e.g., sputtering. PVD is a deposition technique in which a plasma is formed near a target composed of the material that is to be deposited. The ions in the plasma are directed toward the target. As the ions collide with the target, atoms are dislodged, or sputtered, from the target. The sputtered atoms are then transported to the wafer through a region of reduced pressure and condense on the wafer surface to form a thin film. Advantages of sputtering over other deposition techniques include easily controlled film thickness and good film thickness uniformity. In other embodiments, deposition techniques other than PVD can be used to deposit the piezoelectric layer, such as metal-organic chemical vapor deposition (MOCVD) or chemical solution deposition (e.g., sol-gel).

Due to being formed on the crystalline orientation prompting layer 208, the portion of the piezoelectric layer 216 that is formed in the area defined by the aperture 214 (FIG. 3) is a highly crystalline oriented portion 218. The highly crystalline oriented portion 218 defines the active region. The portions of the piezoelectric layer 216 that are formed in the areas over the remaining portion of the dielectric layer 212 are amorphous phase portions 220a and 220b, because the dielectric material below the piezoelectric layer 216 does not cause crystalline orientation. Transition boundaries exist between the highly crystalline oriented portion 218 and the amorphous phase portions 220a and 220b. These boundaries act as cracking stops, such that any defect or stress related cracks originating in the amorphous portions 220a and 220b do not penetrate into the active region. This can lead to lower rates of defects in the completed MEMS devices and higher product yields.

Figure 5:
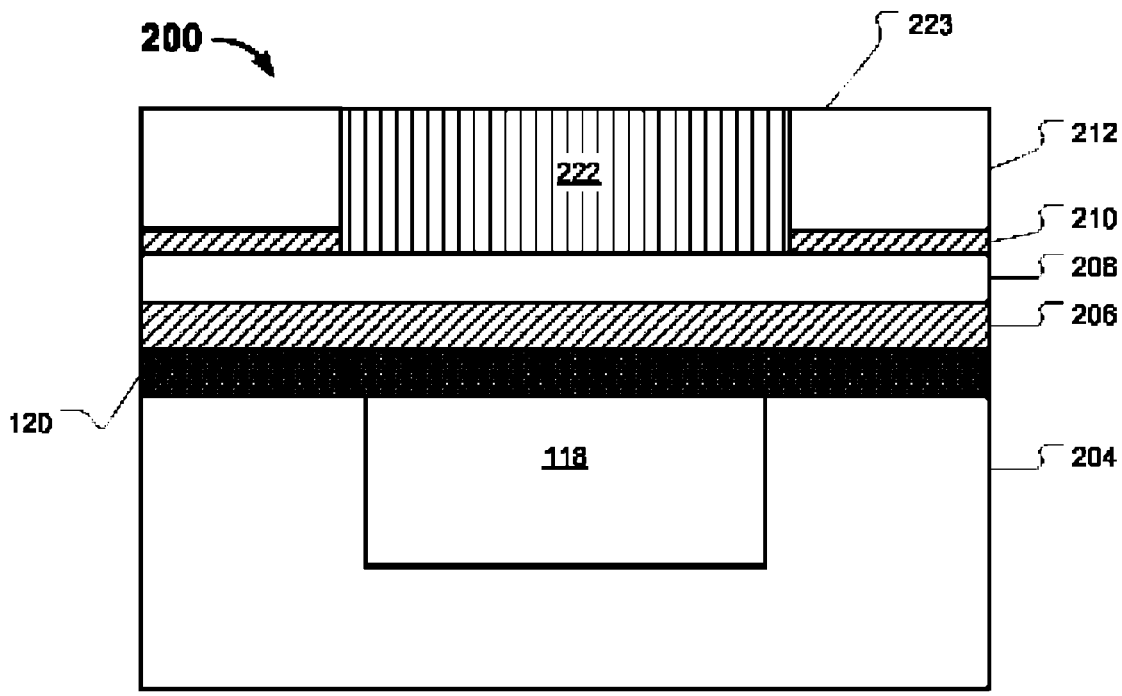
FIG. 5 shows an example of a wafer after a portion of the piezoelectric layer has been removed.

FIG. 5 shows the wafer 200 from FIG. 4 in which the amorphous phase portions 220a and 220b from FIG. 4 and, in some embodiments, part of the highly crystalline oriented portion 218 and part of the dielectric layer 212 have been removed to form a planarized surface 223 and an active actuator region 222 of the piezoelectric material. The unwanted portions of the piezoelectric layer 216 can be removed using one of several wafer manufacturing techniques, including a lithography-etch process as described above or a chemical-mechanical planarization (CMP) process. The planarized surface topography of the planarized surface 223 can ensure a high reliability of second level metallization and subsequent processes, as described further below.

CMP operates to remove material by chemically reacting with the material as well as by physically polishing away material. The CMP apparatus uses a rotating chuck that holds the material to be polished against a polishing surface. Additionally, a slurry is introduced between the polishing surface and the material to be polished. The slurry is a liquid with abrasive particles. Often, the chemical reaction in CMP polishing is dependent on the slurry that is selected. If the piezoelectric layer 216 is formed of PZT, the polishing surface can be a hard polyurethane pad. The slurry can have silica particles and a basic pH, such as a pH of 11. In some implementations, the slurry is P4217, from Fujimi, Co., located in Kiyosu, Japan. For other piezoelectric materials, other polishing pads or polishing liquids may be optimal for polishing.

Figure 6:
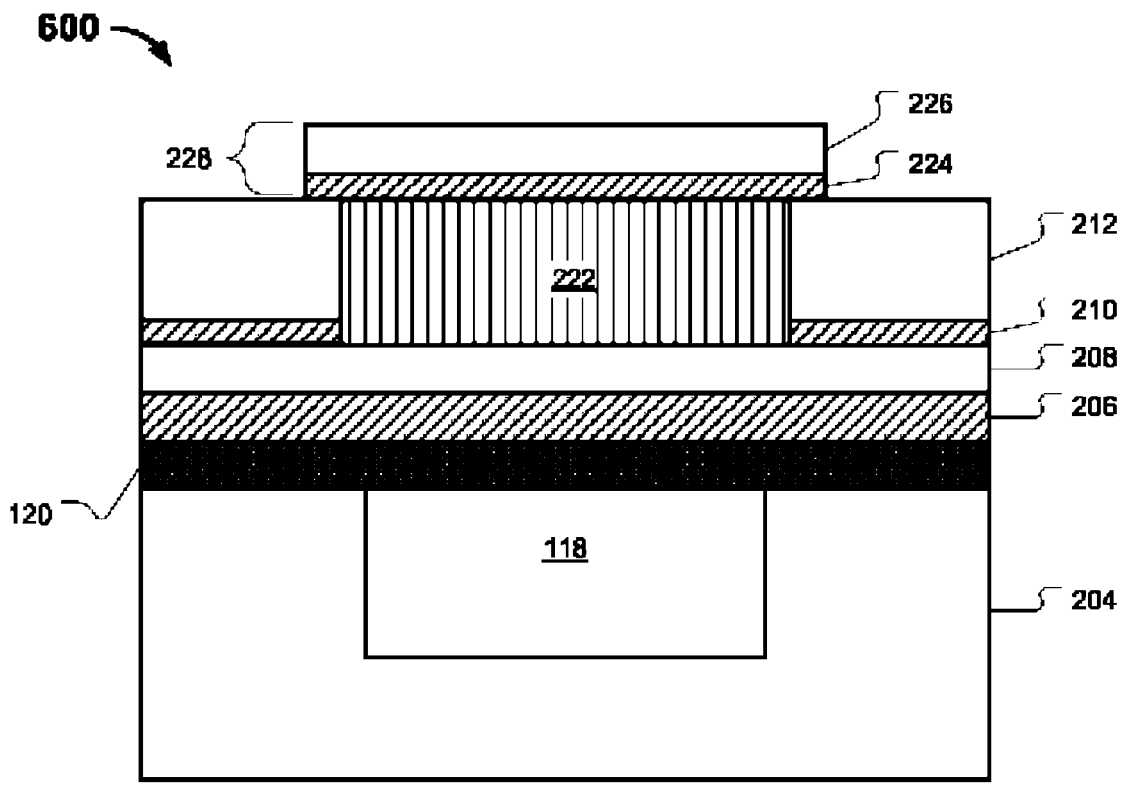
FIG. 6 shows an example of a wafer where an adhesion layer and an electrode have been added on top of the piezoelectric material.

FIG. 6 shows a resulting piezoelectric capacitor or actuator 600 formed from the wafer 200 depicted in FIG. 5. An adhesion prompting conductive layer 224 and a conductive electrode layer 226 have been deposited over the active piezoelectric actuator region 222 to form an electrode 228. The adhesion prompting conductive layer 224 is similar to the adhesion layers 206 and 210. The conductive electrode layer 226 can include a metal, such as gold, silver, aluminum, copper or combinations thereof.

The piezoelectric actuator described above can be used to form a number of micromechanical devices, such as a sensors, transducers, or ink jet print-heads with piezoelectric actuators.

Figure 7:
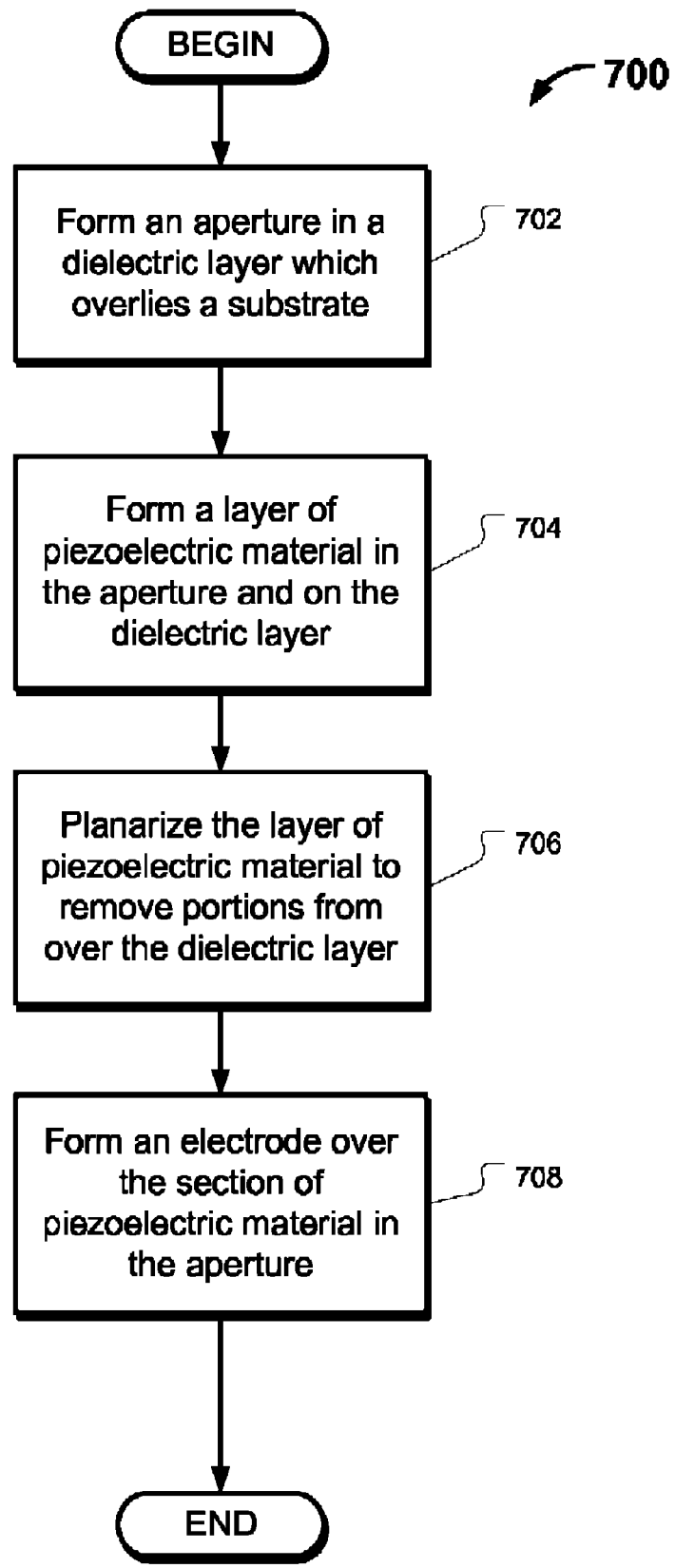
FIG. 7 shows a flow chart of a method for depositing a piezoelectric layer within an aperture of a dielectric layer of a wafer.

FIG. 7 is a flowchart of an exemplary method 700 for depositing a piezoelectric layer within an aperture of a dielectric layer of a wafer. The method 700 can be used to manufacture MEMS devices such as the piezoelectric actuator depicted in FIG. 1.

In the example, at step 702, an aperture is formed in a dielectric layer which overlies a substrate. A portion of the dielectric layer which overlies the substrate is removed in order to form the aperture while other portions of the dielectric layer remain intact. The portion of the dielectric layer to be removed can be removed using any of several techniques for removing material from a wafer surface, such as lithography with wet etch or dry etch. The aperture formed in step 702 defines an active region where a highly crystalline oriented piezoelectric material is to be deposited.

At step 704, a layer of piezoelectric material is formed in the aperture and on the remaining portions of the dielectric layer. The piezoelectric material can be deposited using physical vapor deposition (PVD), sometimes referred to as sputtering. In other embodiments, deposition techniques other than PVD can be used to deposit the piezoelectric layer, such as metal-organic chemical vapor deposition (MOCVD) or chemical solution deposition (e.g., sol-gel).

At step 706, the layer of piezoelectric material is planarized to remove portions from over the dielectric layer. This leaves a section of piezoelectric material in the aperture described in step 702. The unwanted portions of piezoelectric material can be removed using one of several wafer manufacturing techniques, including a lithography-etch process or a chemical-mechanical planarization (CMP) process. The planarization process creates a planarized surface onto which an electrode can be formed.

At step 708, an electrode is formed over the section of piezoelectric material in the aperture. The electrode can be formed by depositing a conductive layer over the piezoelectric material, or by first depositing an adhesion prompting conductive layer over the piezoelectric material and then depositing a conductive layer over the adhesion prompting conductive layer. The conductive electrode layer and adhesion prompting conductive layer can be deposited using one of a number of deposition techniques, including chemical vapor deposition (CVD) or physical vapor deposition (PVD).

Additional steps, such as formation of additional adhesion prompting layers, the dielectric layer, etching of a substrate to form features, such as recess, chambers and apertures, are optionally performed to form the resulting MEMS device.

The method 700 for depositing a piezoelectric layer within an aperture of a dielectric layer of a wafer can lead to increased reliability of manufacturing and higher production yield than traditional methods for producing MEMS devices containing piezoelectric actuators. The inherent high stress in piezoelectric thin films produced using traditional methods as well as stringent process requirements can translate directly into low production yield of MEMs devices containing piezoelectric thin film elements.

One advantage of the techniques described herein is that a piezoelectric layer that is deposited in an aperture and over a dielectric layer forms a highly crystalline oriented portion within the aperture, because the piezoelectric layer is formed on a crystalline orientation prompting layer. The portion deposited over dielectric layer forms an amorphous phase portion, because the dielectric layer does not cause crystalline orientation. Transition boundaries exist between the highly crystalline oriented portion and the amorphous phase portions of the piezoelectric layer. These boundaries act as cracking stops, such that any defect or stress related cracks originating in the amorphous portions do not penetrate into the highly crystalline oriented portion, or active region. This can lead to lower rates of defects in the completed MEMS devices and higher product yields over traditional methods. The methods used to form the piezoelectric material on the substrate can form piezoelectric material with very uniform and desirable properties, such as high density, low voids and high $d_{31}$ coefficients. When each actuator has consistent properties, the individual structures associated with the structures can be operated with very uniform results when the same electrical signals are communicated to each of the structures. For example, in an ink jet printer, if the same voltage is applied across uniform actuators associated with uniform jetting structures, a uniform quantity of ink is ejected from each of the jetting structures.

A number of embodiments of the invention have been described. Nevertheless, it will be understood that various modifications may be made without departing from the spirit and scope of the invention. Accordingly, other embodiments are within the scope of the following claims.

What is claimed is:

1. A device, comprising:
    a substrate with a first surface;
    a crystalline orientation prompting layer on the first surface of the substrate;
    a piezoelectric portion contacting the crystalline orientation prompting layer and having an orientation corresponding to the orientation of the crystalline orientation prompting layer; and
    a dielectric material surrounding the piezoelectric portion, wherein a surface of the dielectric material furthest from the crystalline orientation prompting layer is co-planar with a surface of the piezoelectric portion.

2. A method of forming the device of claim 1, comprising:
    forming an aperture in a dielectric layer which overlies the substrate;
    forming a layer of piezoelectric material in the aperture and on the dielectric layer; and
    planarizing the layer of piezoelectric material to remove portions of the piezoelectric material from over the dielectric layer, leaving a section of piezoelectric material in the aperture.

3. The method of claim 2, wherein forming the layer of piezoelectric material includes sputtering.

4. The method of claim 2, wherein the dielectric layer includes an inorganic material.

5. The method of claim 2, wherein forming the layer of piezoelectric material includes forming the layer on the crystalline orientation promoting layer.

6. The method of claim 2, further comprising forming an electrode over the section of piezoelectric material in the aperture.

7. The method of claim 2, further comprising forming a recess in the substrate, wherein forming the aperture in the dielectric layer includes forming the aperture in the dielectric layer adjacent to the recess in the substrate.

8. The method of claim 2, wherein forming the layer of piezoelectric material includes forming a layer of lead zirconium titanate, lead niobium zirconium titanate or lead lanthanum zirconate titanate.

9. The method of claim 2, wherein forming the aperture in the dielectric layer includes etching the dielectric layer.

10. The method of claim 2, wherein forming the layer of piezoelectric material includes forming an oriented crystalline portion in the aperture and an amorphous portion on the dielectric layer.

11. The device of claim 1, wherein the dielectric material is an inorganic dielectric material.

12. The device of claim 11, wherein the dielectric material is one of silicon dioxide or silicon nitride.

13. The device of claim 1, wherein the substrate has a recess formed therein and the piezoelectric portion overlies the recess.

14. The device of claim 1, wherein the substrate further comprises an outlet on a surface other than the first surface and fluidly connected to the recess.

15. The device of claim 1, further comprising an electrode on an opposite side of the piezoelectric portion from the crystalline orientation prompting layer.

16. The device of claim 1, further comprising an adhesion prompting layer between the dielectric layer and the crystalline orientation prompting layer.

17. The device of claim 16, wherein the adhesion prompting layer is a first adhesion prompting layer and the device further comprises a second adhesion prompting layer between the substrate and the crystalline orientation prompting layer.

18. The device of claim 16, wherein the adhesion prompting layer includes chromium, molybdenum, titanium or tungsten.

19. The device of claim 1, wherein the crystalline orientation prompting layer includes platinum, palladium, gold, silver, iridium or nickel.

20. The device of claim 1, wherein the piezoelectric portion contacting the crystalline orientation prompting layer includes columnar structures having substantially identical crystalline orientations.

21. The device of claim 1, further comprising an electrode on a same side of the piezoelectric portion from the crystalline orientation prompting layer.

22. The device of claim 1, wherein the crystalline orientation prompting layer forms at least part of an electrode of the device.

23. The device of claim 1, further comprising:
    a first adhesion prompting layer between the dielectric material and the crystalline orientation prompting layer; and
    a second adhesion prompting layer between the substrate and the crystalline orientation prompting layer, wherein the first adhesion promoting layer and the second adhesion promoting layer are each of a different material from the crystalline orientation prompting layer.

24. A device, comprising:
    a substrate with a first surface;
    a crystalline orientation prompting layer on the first surface of the substrate;
    a piezoelectric portion contacting the crystalline orientation prompting layer and having an orientation corresponding to the orientation of the crystalline orientation prompting layer;
    a dielectric material surrounding the piezoelectric portion; and
    an adhesion prompting layer between the dielectric material and the crystalline orientation prompting layer.

25. The device of claim 24, wherein the adhesion prompting layer is a first adhesion prompting layer and the device further comprises a second adhesion prompting layer between the substrate and the crystalline orientation prompting layer.

26. The device of claim 24, wherein the adhesion prompting layer includes chromium, molybdenum, titanium or tungsten.

* * * * *

UNITED STATES PATENT AND TRADEMARK OFFICE
CERTIFICATE OF CORRECTION

PATENT NO.       : 8,053,951 B2
APPLICATION NO.  : 12/603800
DATED            : November 8, 2011
INVENTOR(S)      : Youming Li and Jeffrey Birkmeyer It is certified that error appears in the above-identified patent and that said Letters Patent is hereby corrected as shown below:

In Column 8, line 11(Claim 16):

And "dielectric" change "layer" to --material--.

Signed and Sealed this
Twentieth Day of March, 2012

David J. Kappos
*Director of the United States Patent and Trademark Office*